US012620558B2

(12) United States Patent
Kim et al.

(10) Patent No.: US 12,620,558 B2
(45) Date of Patent: May 5, 2026

(54) APPARATUS FOR PROCESSING SUBSTRATE AND METHOD OF PROCESSING SUBSTRATE

(71) Applicant: SEMES CO., LTD., Cheonan-si (KR)

(72) Inventors: Sang Lim Kim, Cheonan-si (KR); Hyun Kyu Choi, Cheonan-si (KR); Do Hwan Jung, Cheonan-si (KR); Jin Kyu Choi, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 86 days.

(21) Appl. No.: 18/387,877

(22) Filed: Nov. 8, 2023

(65) Prior Publication Data

US 2024/0203697 A1     Jun. 20, 2024

(30) Foreign Application Priority Data

Dec. 16, 2022     (KR) ........................ 10-2022-0177296

(51) Int. Cl.
*H01L 21/67* (2006.01)
*H01J 37/32* (2006.01)
*H01L 21/3065* (2006.01)

(52) U.S. Cl.
CPC ..... *H01J 37/32449* (2013.01); *H01J 37/3211* (2013.01); *H01L 21/3065* (2013.01); *H01L 21/67248* (2013.01)

(58) Field of Classification Search
None
See application file for complete search history.

(56) References Cited

U.S. PATENT DOCUMENTS 6,596,091 B1 * 7/2003 Grosenbacher ........... B08B 9/08
                                                               134/21
2007/0202253 A1 * 8/2007 Ong ...................... G02F 1/1337
                                                               427/248.1

(Continued)

FOREIGN PATENT DOCUMENTS

CN        104602436 A      5/2015
KR     10-2007-0094643 A     9/2007

(Continued)

OTHER PUBLICATIONS

Korean Office Action issued in corresponding KR Patent Application No. 10-2022-0177296, dated Sep. 18, 2024, with English translation.

*Primary Examiner* — Shamim Ahmed
(74) *Attorney, Agent, or Firm* — Carter, DeLuca & Farrell LLP

(57) ABSTRACT

A method of processing a substrate using an apparatus for processing a substrate, which generates plasma in a processing space by applying microwaves is provided, the method including a plasma treatment operation of processing a substrate using plasma; a replacing operation of performing the plasma treatment operation a predetermined number of times and replacing a component included in the apparatus; and a backup operation of backing up the apparatus after the replacing operation, wherein the backup operation includes a preheating operation in which the temperature adjusting unit increases a temperature of the processing space by increasing a temperature of coolant supplied to the process chamber; and a bake purge operation performed after the preheating operation and including removing impurities from the component.

16 Claims, 10 Drawing Sheets

(56)　　　　　　　References Cited

U.S. PATENT DOCUMENTS

| | | | |
|---|---|---|---|
| 2008/0169588 A1* | 7/2008 | Shih | ................. H01J 37/32495 |
| | | | 264/483 |
| 2008/0317975 A1 | 12/2008 | Furui | |
| 2010/0104760 A1 | 4/2010 | Matsui | |
| 2015/0118416 A1 | 4/2015 | Jang | |
| 2019/0279850 A1 | 9/2019 | Takayama | |
| 2022/0189742 A1 | 6/2022 | Kim | |
| 2023/0207290 A1 | 6/2023 | Kim | |

FOREIGN PATENT DOCUMENTS

| | | |
|---|---|---|
| KR | 10-2009-0020925 A | 2/2009 |
| KR | 10-2010-0047165 A | 5/2010 |
| KR | 10-2019-0106785 A | 9/2019 |
| KR | 10-2022-0086253 A | 6/2022 |
| KR | 10-2023-0097959 A | 7/2023 |

* cited by examiner

APPARATUS FOR PROCESSING SUBSTRATE AND METHOD OF PROCESSING SUBSTRATE

CROSS-REFERENCE TO RELATED APPLICATIONS

This application claims benefit of priority to Korean Patent Application No. 10-2022-0177296 filed on Dec. 16, 2022 in the Korean Intellectual Property Office, the disclosure of which is incorporated herein by reference in its entirety.

BACKGROUND

1. Field

Embodiments of the present disclosure relate to an apparatus for processing a substrate and a method of processing a substrate which may process a substrate using plasma.

Plasma may be generated by extremely high temperature, strong electric fields, or RF electromagnetic fields, and may refer to an ionized gaseous state of matter including ions, electrons, and radicals. In a process of manufacturing a semiconductor device, various processes may be performed using plasma. For example, an etching process may be performed by radicals and ion particles contained in plasma colliding with a substrate.

In the case of an apparatus for processing a substrate which generates plasma by generating microwaves, durability of components included in the apparatus may decrease during the process. Accordingly, a plasma treatment may be performed on the substrate a predetermined number of times, and a maintenance work such as replacing components may be performed periodically. When durability of the components reaches a threshold and the components are replaced, the replaced components, including inevitable impurities, may be disposed in the apparatus for processing a substrate. When plasma treatment is performed on a substrate while the surface of the replaced component contains impurities (e.g., moisture and/or particles), the degree of contamination in a processing space in which the processing of a substrate is performed may increase such that defects may occur. Also, impurities may be attached to the surface of the substrate, and may hinder efficient plasma treatment for the substrate.

Also, when using a method of performing a purging operation to remove impurities contained in the surface of component, the time required for maintenance may increase. When the maintenance work is prolonged, efficiency in the processing of a substrate may decrease. Furthermore, it may be difficult to easily remove impurities attached to fine grooves on the surface of component by simply performing a purging operation.

2. Description of Related Art

An embodiment of the present disclosure is to provide a method of processing a substrate, which may efficiently perform maintenance of an apparatus for processing a substrate.

Also, an embodiment of the present disclosure is to provide a method of processing a substrate, which may swiftly perform maintenance of an apparatus for processing of a substrate to be swiftly performed.

Also, an embodiment of the present disclosure is to provide a method of processing a substrate, which may efficiently remove impurities on a surface of a component after components included in an apparatus for processing a substrate are replaced.

Also, an embodiment of the present disclosure is to provide a method of processing a substrate which may prevent overloading of a chamber by preliminarily heating or cooling the apparatus for processing a substrate.

SUMMARY

According to an embodiment of the present disclosure, a method of processing a substrate using an apparatus for processing a substrate, which generates plasma in a processing space by applying microwaves, includes a plasma treatment operation of processing a substrate using plasma; a replacing operation of performing the plasma treatment operation a predetermined number of times and replacing a component included in the apparatus; and a backup operation of backing up the apparatus after the replacing operation, wherein the backup operation includes a preheating operation in which the temperature adjusting unit increases a temperature of the processing space by increasing a temperature of coolant supplied to the process chamber; and a bake purge operation performed after the preheating operation and including removing impurities from the component.

The preheating operation may include gradually increasing a temperature of coolant over a predetermined time from a predetermined starting temperature.

The preheating operation may be terminated when a temperature of the coolant reaches a predetermined target temperature, and the bake purge operation is performed after the preheating operation is completed.

The bake purge operation may include forming an atmosphere of the processing space to be normal pressure and forming a temperature of the processing space to be 100 to 200 degrees Celsius.

The bake purge operation may include supplying purging gas to the processing space.

The backup operation may further include a primary purging operation of purging the processing space; and a secondary purging operation of performing a secondary purge of the processing space after the primary purging operation.

The backup operation may further include a pre-cooling operation performed after the secondary purging operation and including lowering a temperature of the processing space by lowering a temperature of the coolant to a predetermined starting temperature.

The pre-cooling operation may include gradually lowering a temperature of the coolant to a starting temperature over a predetermined period of time.

The heating operation and pre-cooling operation may include controlling temperature of the coolant in units of 5 to 10 degrees Celsius according to a predetermined time interval by the temperature adjusting unit.

The primary purging operation may include identifying leakage in the processing space by supplying purging gas to the processing space formed at room temperature, and primarily purging the processing space by exhausting the purging gas supplied to the processing space, and the secondary purging operation includes identifying leakage in the processing space by increasing a temperature of the processing space and supplying purging gas to the processing space formed at a high temperature, and secondarily purging the processing space by exhausting the purging gas supplied to the processing space.

According to an embodiment of the present disclosure, a method of processing a substrate, including replacing components included in an apparatus for processing a substrate and backing up the apparatus, wherein the backing up the apparatus includes a preheating operation in which a temperature adjusting unit increases a temperature of a processing space by increasing a temperature of coolant supplied to a process chamber; and a bake purge operation performed after the preheating operation and including removing impurities including moisture contained in the component and/or particles attached to the component.

The preheating operation may include gradually increasing a temperature of the coolant over a predetermined period of time from a predetermined starting temperature to a predetermined target temperature.

In the bake purge operation, pressure in the processing space may be formed to be normal pressure, in the bake purge operation, a temperature of the processing space may be determined to be 100 to 200 degrees Celsius, and the bake purge operation may include purging the processing space by supplying purging gas to the processing space in which the substrate is processed.

The backing up the apparatus may include a primary purging operation including identifying leakage in the processing space by supplying purging gas to the processing space formed at room temperature, and purging the processing space by exhausting the purging gas supplied to the processing space, and the primary purging operation is performed after the bake purge operation.

The backing up the apparatus may further include a secondary purging operation including identifying leakage in the processing space by increasing a temperature of the processing space and supplying purging gas to the processing space formed at a high temperature, and secondarily purging the processing space by exhausting the purging gas supplied to the processing space, after the primary purging operation.

The backing up the apparatus may further include a pre-cooling operation including lowering a temperature of the processing space to the starting temperature by lowering a temperature of the coolant and performed after the secondary purging operation.

According to an embodiment of the present disclosure, an apparatus for processing a substrate includes a process chamber having a processing space therein and a cooling path through which the coolant flows; a support unit disposed in the processing space and including a body configured to support a substrate and a heating unit configured to heat the substrate; a pressure reduction unit connected to an exhaust line configured to discharge impurities in the processing space, and configured to provide negative pressure to the processing space; a gas supply unit provided on one sidewall of the process chamber and configured to supply gas to the processing space; a microwave application unit disposed above the support unit and configured to generate and apply microwaves; a radiation unit configured to transmit the generated microwaves to the processing space; a temperature adjusting unit configured to supply the coolant to the cooling path and to control a temperature of the coolant; and a controller, wherein the controller increases a temperature of the processing space by increasing a temperature of the coolant by controlling the temperature adjusting unit.

The controller may gradually increase a temperature of the coolant over a predetermined time from a predetermined starting temperature to a predetermined target temperature by controlling the temperature adjusting unit.

To discharge impurities in the processing space, the controller may adjust a temperature of the processing space to be 100 to 200 degrees Celsius by controlling the heating unit, and may adjust pressure in the processing space to normal pressure by controlling the pressure reduction unit.

The controller may start controlling of the heating unit after a temperature of the coolant reaches the target temperature.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
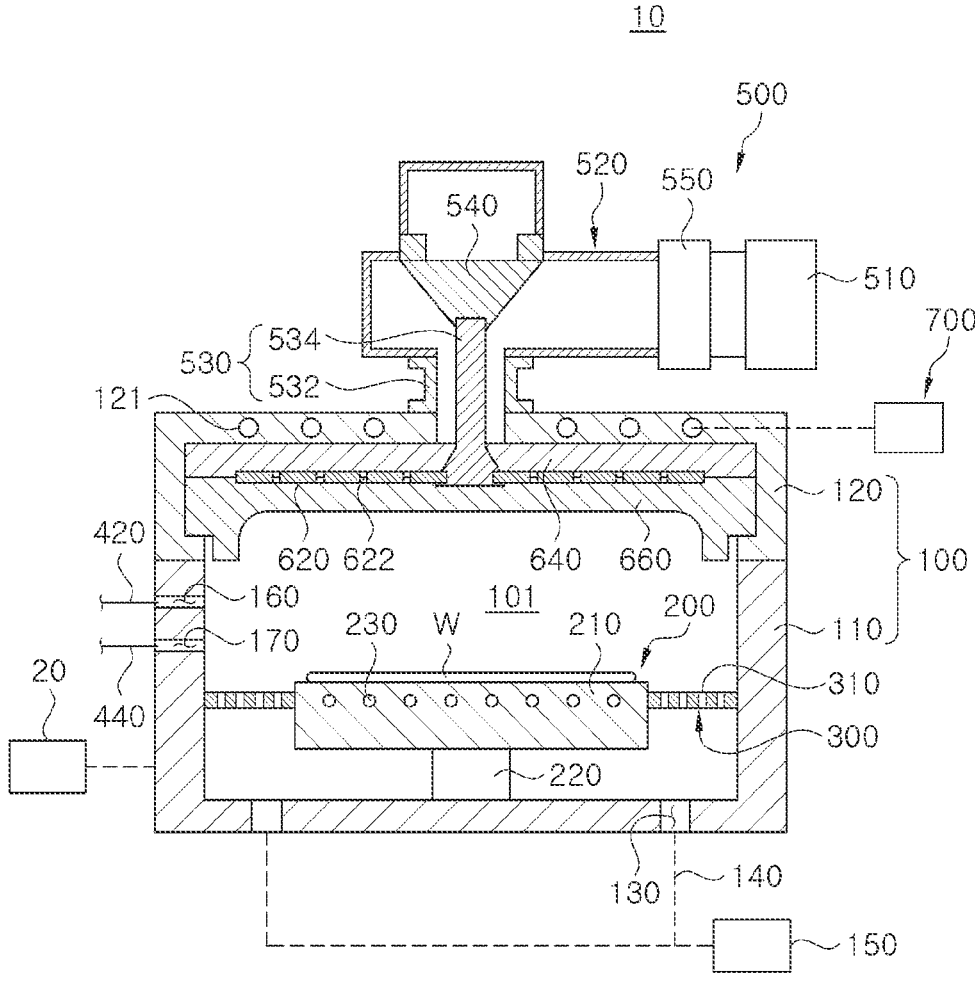
FIG. 1 is a diagram illustrating an apparatus for processing a substrate according to an embodiment of the present disclosure

Hereinafter, embodiments of the present disclosure will be described as below with reference to the attached drawings.

Various embodiments will be described with reference to accompanying drawings. However, this may not necessarily limit the scope of the embodiments to a specific embodiment form. Instead, modifications, equivalents and replacements included in the disclosed concept and technical scope thereof description may be employed. Throughout the specification, similar reference numerals are used for similar elements.

In the embodiments, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the embodiments.

FIG. 1 is a diagram illustrating an apparatus for processing a substrate according to an embodiment. Hereinafter, the apparatus for processing a substrate in which a method of processing a substrate according to an embodiment is performed will be described in detail with reference to FIG. 1.

The apparatus 10 for processing a substrate may process a substrate w. The apparatus 10 for processing a substrate according to an embodiment may process substrate w using plasma. For example, the apparatus 10 for processing a substrate may perform an etching process of removing a thin film on the substrate w using plasma, an ashing process of removing a photoresist film, a deposition process of forming a thin film on the substrate w, or a dry cleaning process. Optionally, the apparatus 10 for processing a substrate may perform an annealing process on the substrate w using hydrogen plasma. However, an embodiment thereof is not limited thereto, and the plasma treatment process performed in the apparatus 10 for processing a substrate may be varied from a generally used plasma treatment process. The substrate w insert into the apparatus 10 for processing a substrate may be a substrate w on which portion of the treatment process has been performed. For example, the substrate w inserted into the apparatus 10 for processing a substrate may be a substrate w on which an etching process or a photographic process has already been performed.

Also, in the apparatus 10 for processing a substrate, the plasma treatment may be performed on the substrate w a predetermined number of times, and a maintenance process may be performed. For example, the apparatus 10 for processing a substrate may process the substrates w a predetermined number of times and may perform a maintenance process. A detailed description thereof will be provided later.

Referring to FIG. 1, the apparatus 10 for processing a substrate may include a controller 20, a process chamber 100, a support unit 200, an exhaust baffle 300, a gas supply unit 400, a microwave application unit 500, a radiation unit 600, and a temperature adjusting unit 700.

The controller 20 may include a process controller consisting of a microprocessor (computer) executing control of the apparatus 10 for processing a substrate, a keyboard on which an operator performs command input operations to manage the apparatus 10 for processing a substrate, a user interface consisting of a display for visualizing and displaying an operating status of the apparatus 10 for processing a substrate, a control program for executing processing performed on a substrate under the control of a process controller in the apparatus 10 for processing a substrate, a program to execute processing in each component according to various data and processing conditions, that is, a memory unit in which a processing recipe is stored. The processing recipe may be stored in a storage medium in the storage unit, and the storage medium may be implemented as a hard disk, a portable disk such as a CD-ROM or DVD, or a semiconductor memory such as a flash memory.

The controller 20 may control the apparatus 10 for processing a substrate to perform the method of processing a substrate described below. For example, the controller 20 may control components provided in the apparatus 10 for processing a substrate to perform the method of processing a substrate described below.

The process chamber 100 may include a processing space 101 therein. The processing space 101 may be provided as a space in which processing of substrate w is performed. The processing space 101 may function as a space in which process gas g1 is supplied and plasma is formed when a plasma treatment operation (s10) is performed. Also, the processing space 101 may function as a purging space to which purging gas g2 is supplied when a maintenance operation (s20) is performed.

The process chamber 100 may include a body 110 and a cover 120. The body 110 may have an open upper surface and may have an internal space. For example, the body 110 may have an internal space and may have a cylindrical shape having an open upper surface. The cover 120 may be disposed on an upper end of body 110. The cover 120 may seal the open upper surface of body 110. For example, the cover 120 may be provided in a cylindrical shape having an open lower surface. An internal side of a lower end of the cover 120 may be stepped such that an upper space may have a larger radius than that of a lower space. The body 110 and the cover 120 may be combined to define the process chamber 100. Also, by combining the body 110 with the cover 120, an internal space of the body 110 may function as the processing space 101 described above.

The cover 120 may further include a cooling path 121 through which a coolant may flow. A cooling fluid may be supplied to the cooling path 121. For example, the cooling fluid may be a coolant. The temperature of the coolant flowing in cooling path 121 may be controlled by the controller 20. Here, the coolant flowing through the cooling path 121 may maintain the temperature in the process chamber 100 at a predetermined temperature, that is, the temperature of the processing space 101 may be maintained at a predetermined temperature.

An opening (not illustrated) may be formed on one sidewall of the process chamber 100. The opening (not illustrated) may function as a passage through which the substrate w may be taken out of the processing space 101 or the substrate w may be insert into the processing space 101. An opening (not illustrated) may be selectively shielded by a door (not illustrated). For example, an opening (not illustrated) may be formed on one sidewall of the body 110. The internal sidewall of process chamber 100 may be coated. For example, the internal sidewall of the process chamber 100 may be coated with a material including quartz.

An exhaust hole 130 may be formed on a bottom surface of the process chamber 100. For example, the exhaust hole 130 may be formed on a lower surface of body 110. The exhaust hole 130 may be connected to an exhaust line 140. The exhaust line 140 may discharge impurities (byproducts) flowing in the processing space 101 to externally of the processing space 101. For example, impurities may include moisture, process gases, and/or particles.

One end of exhaust line 140 may be connected to the exhaust hole 130, and the other end of exhaust line 140 may be connected to the pressure reduction unit 150. The pressure reduction unit 150 may provide negative pressure to the processing space 101. The pressure reduction unit 150 may be configured as a pump. However, an embodiment thereof is not limited thereto, and the pressure reduction unit 150 may be varied, such as a generally used apparatus which may provide negative pressure. Due to exhaust through the exhaust hole 130 and the exhaust line 140, the internal region of the process chamber 100 may be maintained at a pressure lower than normal pressure in the plasma treatment operation (s10).

The support unit 200 may be disposed in the processing space 101. The support unit 200 may support the substrate w in the processing space 101. For example, the support unit 200 may be an ESC for chucking the substrate w using electrostatic force. Optionally, the support unit 200 may physically support the substrate w by mechanical clamping.

Alternatively, the support unit 200 may not provide a means for fixing the substrate w, and the substrate w may be disposed on the support unit 200.

The support unit 200 may include a body 210, a support shaft 220, and a heating unit 230. The body 210 may support the substrate w. The upper surface of body 210 may be provided as a support surface to support the substrate w. The substrate w may be seated on the upper surface of body 210. For example, the body 210 may be provided as a dielectric substance. The body 210 may be provided as a disc-shaped dielectric plate. A diameter of the upper surface of body 210 may be relatively larger than a diameter of substrate w.

A pin hole (not illustrated), which is a passage through which a lift pin (not illustrated) moves, may be formed in the body 210. A plurality of pin holes (not illustrated) may be formed in the body 210 and may extend to the upper end of the body 210. The number of provided lift pins (not illustrated) may correspond to the number of pin holes (not illustrated), the lift pins may move in the vertical direction in the length direction of the pin holes (not illustrated), and may loads the substrate w into the body 210, or may unload the substrate w disposed on the body 210.

The support shaft 220 may support the body 210. The support shaft 220 may be coupled to the body 210 in a lower portion of the body 210. The support shaft 220 may be coupled to the process chamber 100. For example, the support shaft 220 may be coupled to a bottom surface of the body 110.

The heating unit 230 may be provided in the body 210. The heating unit 230 may heat the substrate w. The heating unit 230 may heat the substrate w supported on the upper surface of the body 210. The heating unit 230 may increase the temperature of the body 210 and may heat the substrate w. For example, the heating unit 230 may be provided as a heating element for generating heat by resisting a current flowing from power applied from an external entity. The heating unit 230 may be a heating element such as tungsten. However, the type of heating unit 230 is not limited thereto, and may be varied to generally used heating elements.

Heat generated by the heating unit 230 may be transferred to the substrate w through the body 210. The substrate w may be maintained at the determined temperature required for the process by the heat generated by the heating unit 230. Also, the heating unit 230 may increase the temperature of the body 210 to prevent impurities (e.g., various oxide films) separated from the substrate w from reattaching to the substrate w while the substrate w is processed.

Although not illustrated, in an embodiment, the heating unit 230 may be provided with a plurality of spiral-shaped coils. The heating unit 230 may be provided in different regions of the body 210, respectively. For example, a heating unit 230 for heating a region including a center of the body 210 and a heating unit 230 for heating a region surrounding the region including the center of the body 210 (e.g., an edge region of the body 210) may be provided, and the degrees of heating of the heating units 230 may be controlled independently of each other.

Also, the heating unit 230 may control the temperature of the processing space 101 when performing a maintenance operation (s20) described later. When the maintenance operation (s20) is performed, the maintenance operation (s20) may be performed in the absence of the substrate w on the body 210, such that heat generated in the heating unit 230 may be transferred to the processing space 101 through the body 210.

The exhaust baffle 300 may uniformly exhaust an airflow in the processing space 101 to the exhaust line 140. For example, the exhaust baffle 300 may uniformly exhaust plasma generated in the processing space 101 for each region in the plasma treatment operation (s10) described later. Also, the exhaust baffle 300 may guide impurities included in the replaced component to be easily exhausted to the exhaust line 140 in the maintenance operation (s20) described later.

When viewed from above in the drawings, the exhaust baffle 300 may have an annular ring shape. The exhaust baffle 300 may be disposed between the internal sidewall of the process chamber 100 and the support unit 200 in the processing space 101. As an example, the exhaust baffle 300 may be disposed between the internal sidewall of the body 110 and the external side surface of the body 210. The exhaust baffle 300 may include a plurality of exhaust holes 310. The exhaust holes 310 may be provided as through-holes extending from an upper end to a lower end of the exhaust baffle 300. The exhaust holes 310 may be arranged to be spaced apart from each other in a direction of a circumferential of the exhaust baffle 300.

The gas supply unit 400 may supply gas to the processing space 101. The gas supply unit 400 may include a process gas supply member 420 and a purging gas supply member 440.

The process gas supply member 420 may supply process gas g1 into the processing space 101. The process gas supply member 420 may supply process gas g1 to the processing space 101 through the process gas supply hole 160 formed in the sidewall of the process chamber 100. For example, the process gas g1 may contain fluorine or hydrogen. For example, the process gas g1 may be nitrogen trifluoride (nf3) or ammonia (nh3).

The purging gas supply member 440 may supply purging gas g2 into the processing space 101. The purging gas supply member 440 may supply purging gas g2 to the processing space 101 through the purging gas supply hole 170 formed in the sidewall of the process chamber 100. For example, purging gas g2 may include argon (ar).

Differently from the above-mentioned example, only one gas supply hole may be formed in the sidewall of the process chamber 100, and the gas supply line connected to the gas supply hole may branch to supply process gas and purging gas into the processing space 101.

The microwave application unit 500 may apply microwaves to the radiation unit 600, which will be described later. The microwave application unit 500 may include a microwave generator 510, a first waveguide 520, a second waveguide 530, a phase shifter 540, and a matching network 550.

The microwave generator 510 may generate microwaves. The microwave generator 510 may be connected to the first waveguide 520, which will be described later. In an embodiment, the microwave generator 510 may be disposed externally of the process chamber 100.

The first waveguide 520 may be connected to the microwave generator 510, and a passage may be formed therein. Microwaves generated by the microwave generator 510 may be transferred along the first waveguide 520 to the phase shifter 540, which will be described later.

The second waveguide 530 may include an external conductor 532 and an internal conductor 534.

The external conductor 532 may extend in a vertical direction downwardly from an end of the first waveguide 520, and a passage may be formed therein. An upper end of the external conductor 532 may be connected to a lower end of the first waveguide 520, and a lower end of the external conductor 532 may be connected to an upper end of the cover 120.

The internal conductor 534 may be disposed in the external conductor 532. The internal conductor 534 may be provided as a cylindrical rod, and a length direction thereof may be arranged parallel to the vertical direction. An upper end of the internal conductor 534 may be inserted into and fixed to a lower end of a phase shifter 540, which will be described later. The internal conductor 534 may extend in a downward direction such that a lower end thereof may be disposed in the process chamber 100. The lower end of the internal conductor 534 may be fixed and coupled to a center of the antenna plate 620, which will be described later. The internal conductor 534 may be disposed perpendicular to the upper surface of the antenna plate 620.

The internal conductor 534 may be coated with a first plating film and a second plating film on a copper rod thereof. For example, the first plating film may be formed of a nickel (Ni) material. For example, the second plating film may be formed of gold (Au) material. In this case, microwaves may propagate to the antenna plate 620 mainly through the first plating film. Microwaves of which a phase has been changed in the phase shifter 540, which will be described later, may be transferred to the antenna plate 620 along the second waveguide 530.

The phase shifter 540 may be provided at a point at which the first waveguide 520 and the second waveguide 530 are connected to each other. The phase shifter 540 may change a phase of microwaves. The phase shifter 540 may be provided in a cone shape with a pointed bottom. The phase shifter 540 may propagate microwaves transferred from the first waveguide 520 to the second waveguide 530 while a mode of the microwaves is converted. The phase shifter 540 may convert microwaves from te mode to tem mode.

The matching network 550 may be provided to the first waveguide 520. The matching network 550 may match microwaves propagating through the first waveguide 520 to a predetermined frequency.

The radiation unit 600 may transfer microwaves generated by the microwave application unit 500 to the processing space 101. The radiation unit 600 may include an antenna plate 620, a slow wave 640, and a dielectric plate 660.

The antenna plate 620 may radiate microwaves. The antenna plate 620 may be disposed between the slow wave 640 and the dielectric plate 660, which will be described later. For example, the antenna plate 620 may be disposed below the slow wave 640 and may be disposed above the dielectric plate 660.

The antenna plate 620 may be provided in a plate shape. For example, antenna plate 620 may be provided as a thin disk. The antenna plate 620 may be disposed above the support unit 200 to oppose the body 210. A plurality of slots 622 may be formed in the antenna plate 620. The slots 622 may be provided in a "−" shape, but an embodiment thereof is not limited thereto, and the shape and arrangement of the slots 622 may be varied.

The slow wave 640 may be disposed above the antenna plate 620. The slow wave 640 may be supplied as a disk having a predetermined thickness. The slow wave 640 may have a radius corresponding to the internal side of the cover 120. Microwaves propagating vertically through the internal conductor 534 may propagate in the radial direction of the slow wave 640. Wavelengths of microwaves propagated through the slow wave 640 may be compressed and microwaves may resonate. Also, the slow wave 640 may re-reflect microwaves reflected from the dielectric plate 660, and may return the microwaves to the dielectric plate 660.

The dielectric plate 660 may function as an upper wall of the processing space 101. For example, the dielectric plate 660 may be disposed below the antenna plate 620 and may be provided in the shape of a disk having a predetermined thickness. A lower surface of dielectric plate 660 may be provided as a concave surface indented toward the internal side. The lower surface of the dielectric plate 660 may be disposed on the same level as a level of the lower end of the cover 120. The side portion of the dielectric plate 660 may be stepped such that an upper end thereof may have a radius larger than that of the lower end. The upper end of the dielectric plate 660 may be disposed on the stepped lower end of the cover 120. The lower end of the dielectric plate 660 may have a radius smaller than that of the lower end of cover 120, and may maintain a predetermined distance from the lower end of cover 120. The dielectric plate 660 may be provided as a material including a dielectric material.

Microwaves may be radiated to the processing space 101 through the dielectric plate 660. The process gas supplied into the processing space 101 may be excited into a plasma state by an electric field of the radiated microwave. Ions, electrons, and/or radicals contained in the plasma may act on the substrate w disposed in the processing space 101 and may process the substrate w.

The temperature adjusting unit 700 may be provided externally of the process chamber 100 and may supply a coolant through the cooling path 121 formed in the cover 120. The supplied coolant may flow through the cooling path 121 and may maintain the temperature in the process chamber 100, that is, the temperature of the processing space 101, to be a specific temperature. In this case, the temperature adjusting unit 700 may be configured as a chiller, and the controller 20 may control the temperature adjusting unit 700 to raise or lower the temperature of the coolant. In the backup operation (s40), which will be described later, the temperature adjusting unit 700 may increase the temperature of the processing space 101 by increasing the temperature of the coolant and may optimize the processing space 101 to be suitable for the bake purge operation (s420). More specifically, the controller 20 may increase the temperature of the processing space 101 by increasing the temperature of the coolant by controlling the temperature adjusting unit 700 in a preheating operation (s410) to be described later. Accordingly, as the temperature of the processing space 101 is preheated, baking efficiency may be increased in the bake purge operation (s420), which will be described later. To this end, after the temperature of the coolant reaches the predetermined target temperature, the controller 20 may control the heating unit 230 such that the bake purge operation (s420) may be performed.

The controller 20 may control the temperature adjusting unit 700 to gradually increase the temperature of the coolant over a predetermined time from a predetermined starting temperature to a predetermined target temperature. For example, the temperature adjusting unit 700 may initially have a predetermined starting temperature of 30 to 35 degrees Celsius, may increase the temperature of the coolant to a predetermined target temperature of 45 to 60 degrees Celsius, and may increase the temperature of the coolant by 5 to 10 degrees Celsius every 2 minutes. Here, the temperature of the coolant may be adjusted by a refrigerant circulating in the temperature adjusting unit 700, and accordingly, more specifically, the temperature determined in the temperature adjusting unit 700 may be increased by 5 to 10 degrees Celsius every 2 minutes, such that the temperature of the coolant supplied to the cooling path 121 may be increased by 5 to 10 degrees Celsius, which may rapidly increase the temperature of the coolant, such that the cooling path 121 and the cover 120 including the same may be prevented from being damaged, and the temperature of the processing space 101 may be optimized. Also, the controller 20 may control the temperature adjusting unit 700 in a pre-cooling operation (s450) and may lower the temperature of the coolant having reached the target temperature to the starting temperature, thereby lowering the temperature of the processing space 101. Similarly, the controller 20 may control the temperature adjusting unit 700 to gradually lower the temperature of the coolant over a predetermined period of time from the target temperature to the starting temperature.

The method of processing a substrate according to an embodiment described below may be performed in the apparatus 10 for processing a substrate described above. Also, the controller 20 may control the components of the apparatus 10 for processing a substrate such that the apparatus 10 for processing a substrate may perform the apparatus for processing a substrate described below.

Figure 2:
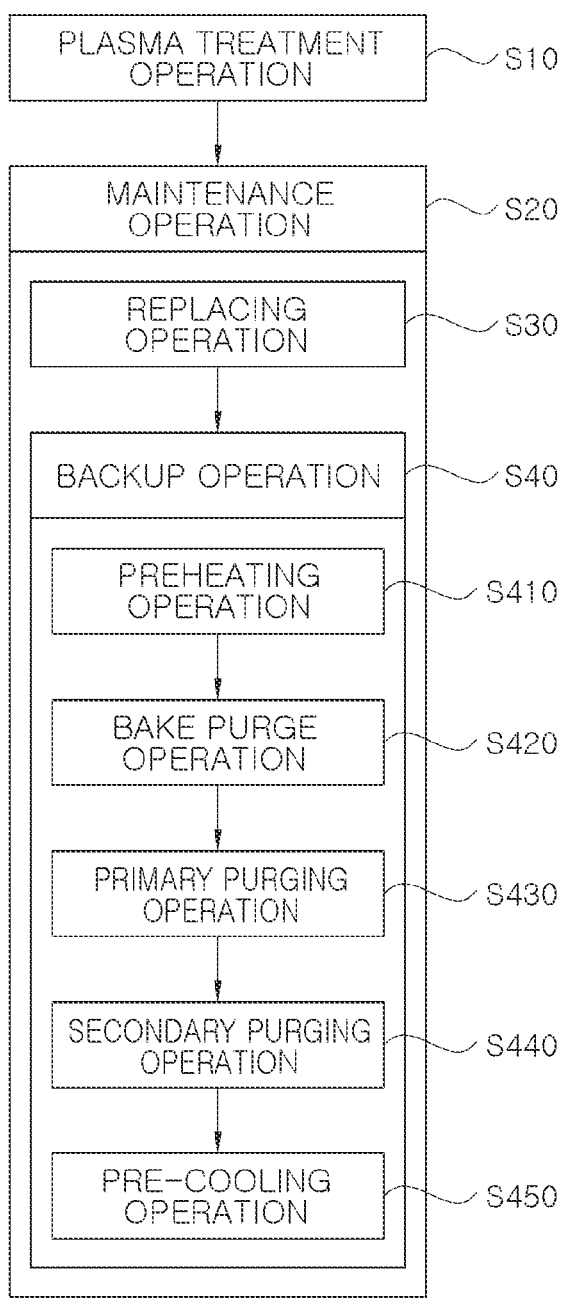
FIG. 2 is a flowchart illustrating a method of processing a substrate according to an embodiment of the present disclosure.
Figure 4:
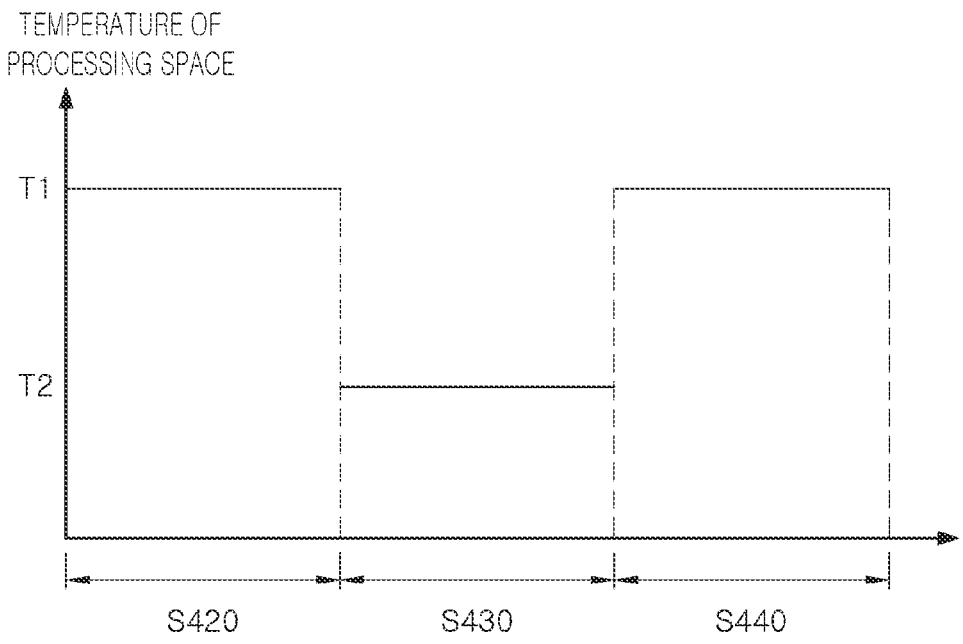
FIG. 4 is a graph illustrating a temperature of a processing space in a maintenance operation according to the embodiment in FIG. 2.

FIG. 2 is a flowchart illustrating a method of processing a substrate according to an embodiment. FIG. 4 is a graph illustrating a temperature of a processing space in a maintenance operation according to the embodiment in FIG. 2. FIGS. 5 to 9 are diagrams illustrating operations of the method of processing a substrate according to an embodiment.

Referring to FIG. 2, the method of processing a substrate according to an embodiment may include a plasma treatment operation (s10) and a maintenance operation (s20). The maintenance operation (s20) may include a replacing operation (s30) and a backup operation (s40). The backup operation (s40) may include a preheating operation (s410), a bake purge operation (s420), a primary purging operation (s430), a secondary purging operation (s440), and a pre-cooling operation (s450).

The plasma treatment operation (s10) may process a substrate w. In an embodiment, in the plasma treatment operation (s10), the substrate w may be processed using plasma p. In the maintenance operation (s20), a maintenance operation may be performed on the components (hereinafter, collectively referred to as "components") included in the apparatus 10 for processing a substrate. The replacing operation (s30) may include performing a replacing operation on components having a high level of consumption. The backup operation (s40) may perform an operation to create an environment suitable for the apparatus 10 for processing a substrate to perform a plasma treatment operation (s10) after the replacing operation for the components is completed. In the backup operation (s40), the internal environment of processing space 101 may be created as an environment in which the plasma treatment operation (s10) is performed. For example, in the backup operation (s40), the process chamber 100 may be checked for leakage and/or the processing space 101 may be checked for impurities b.

Figure 5:
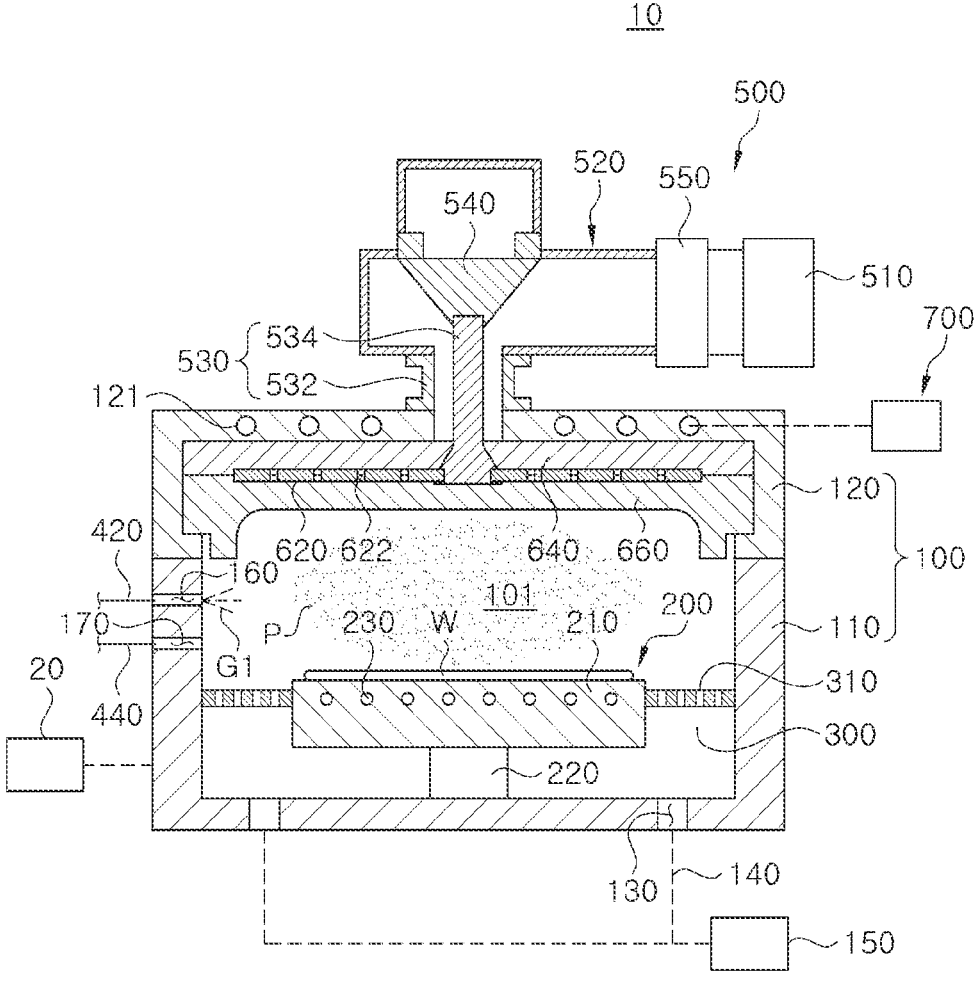
FIG. 5 is a diagram illustrating a state of an apparatus for processing a substrate in which an operation of processing plasma is performed according to the embodiment in FIG. 2.

FIG. 5 is a diagram illustrating a state of an apparatus for processing a substrate in which an operation of processing plasma is performed according to the embodiment in FIG. 2. Referring to FIGS. 2 and 5, in the plasma treatment operation (s10), the process gas supply member 420 may supply process gas g1 to the processing space 101 through the process gas supply hole 160 formed in the sidewall of the process chamber 100. The process gas g1 supplied to the processing space 101 may be excited into a plasma p state by an electric field of microwaves radiated from the microwave application unit 500 and the radiation unit 600 to the processing space 101. The plasma p formed in the processing space 101 may act on the substrate w supported by the upper surface of the body 210 and may process the substrate w.

The plasma treatment operation (s10) may be performed a predetermined number of times. The plasma treatment operation (s10) may process plasma p on the substrate w a predetermined number of times. For example, the plasma treatment operation (s10) may perform plasma p processing on a predetermined number of substrates w. The maintenance operation (s20) may be performed after processing a predetermined number of substrates w in the plasma treatment operation (s10). In an embodiment, the number of predetermined substrates w processed by the apparatus 10 for processing a substrate may be approximately 5,000 or more.

Referring to FIG. 2, the replacing operation (s30) may be performed after the plasma treatment operation (s10). As described above, the replacing operation (s30) may be performed after processing a predetermined number of substrates w in the plasma treatment operation (s10).

In the replacing operation (s30) in an embodiment, a component replacing operation may be performed. For example, in the replacing operation (s30), a replacing operation is performed on components severely damaged (e.g., worn) due to exposure to plasma p while performing the plasma treatment operation (s10). The component replaced in the replacing operation (s30) according to an embodiment may be at least one of the components included in the apparatus 10 for processing a substrate. For example, the component replaced in the replacing operation (s30) may be at least one of the heating unit 230, the exhaust baffle 300, and the radiation unit 600. Hereinafter, for ease of description, in the embodiment described above, the component replaced in the replacing operation (s30) may be the dielectric plate 660.

Figure 6:
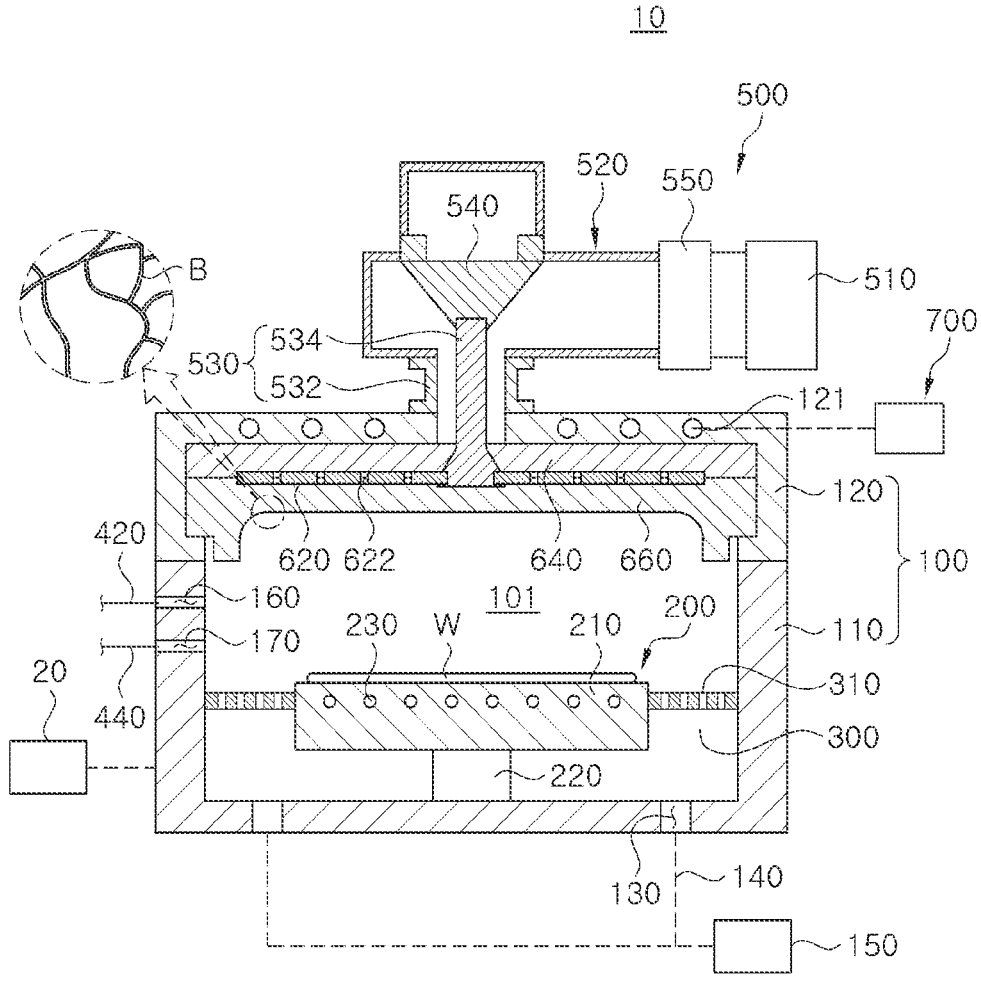
FIG. 6 is an enlarged diagram illustrating a state of a surface of a replaced component after a replacing operation is completed according to the embodiment in FIG. 2.

FIG. 6 is an enlarged diagram illustrating a state of a surface of a replaced component after a replacing operation is completed according to the embodiment. Referring to FIG. 6, fine valleys each having a depth of 1 micrometer or less may be formed on the surface of the replaced dielectric plate 660. Such fine valleys may be formed in the dielectric plate 660 and also in the components replaced in the apparatus 10 for processing a substrate, and may be mounted on the apparatus 10 for processing a substrate. The fine valleys in a component may occur during the process of manufacturing a component (e.g., a polishing process). In other words, the surface of the component to be replaced may be mounted on the apparatus 10 for processing a substrate with initially fine valleys formed therein.

Impurities (byproduct, b) may be attached to the fine valleys formed on the surface of the component. In the replacing operation (s30), impurities b may be included in the component and may be mounted on the apparatus 10 for processing a substrate. For example, impurities b may include moisture, particles, and/or outgassing.

Referring to FIG. 2, a preheating operation (s410) of the backup operation (s40) according to an embodiment may be performed prior to the bake purge operation (s420), which will be described later. The preheating operation (s410) according to an embodiment may increase the temperature of the processing space 101 by allowing the temperature adjusting unit 700 to increase the temperature of the coolant supplied to the process chamber 100 before the bake purge operation (s420) is performed. By preheating the temperature of the processing space 101, efficiency of baking performed in the bake purge operation (s420), which will be described later, may be increased.

Figure 3A:
FIG. 3A is a graph illustrating changes in temperature over time in a preheating operation according to an embodiment of the present disclosure.

Referring to FIG. 3A, the preheating operation (s410) may gradually increase the temperature of the coolant over a predetermined time from a predetermined starting temperature. For example, the starting temperature ta may be 35 to 40 degrees Celsius, may be raised to the intermediate temperature tb, which is 40 to 50 degrees Celsius, after 2 minutes, and may be increased to the target temperature tc, which is 45 to 60 degrees Celsius, after 2 minutes. In other words, by gradually ramping up the temperature of the coolant, overload of the process chamber 100 and the cooling path 121 to which the coolant is supplied may be prevented. The preheating operation (s410) may be terminated when the temperature of the coolant reaches the predetermined target temperature, and the bake purge operation (s420), which will be described later, may be performed. Accordingly, efficiency in the baking performed in the bake purge operation (s420) may be increased. However, the bake purge operation (s420), which will be described later, may be performed during the preheating operation (s410), and for example, the bake purge operation (s420) may be performed after reaching the intermediate temperature tb, which will be included in embodiments.

Figure 7:
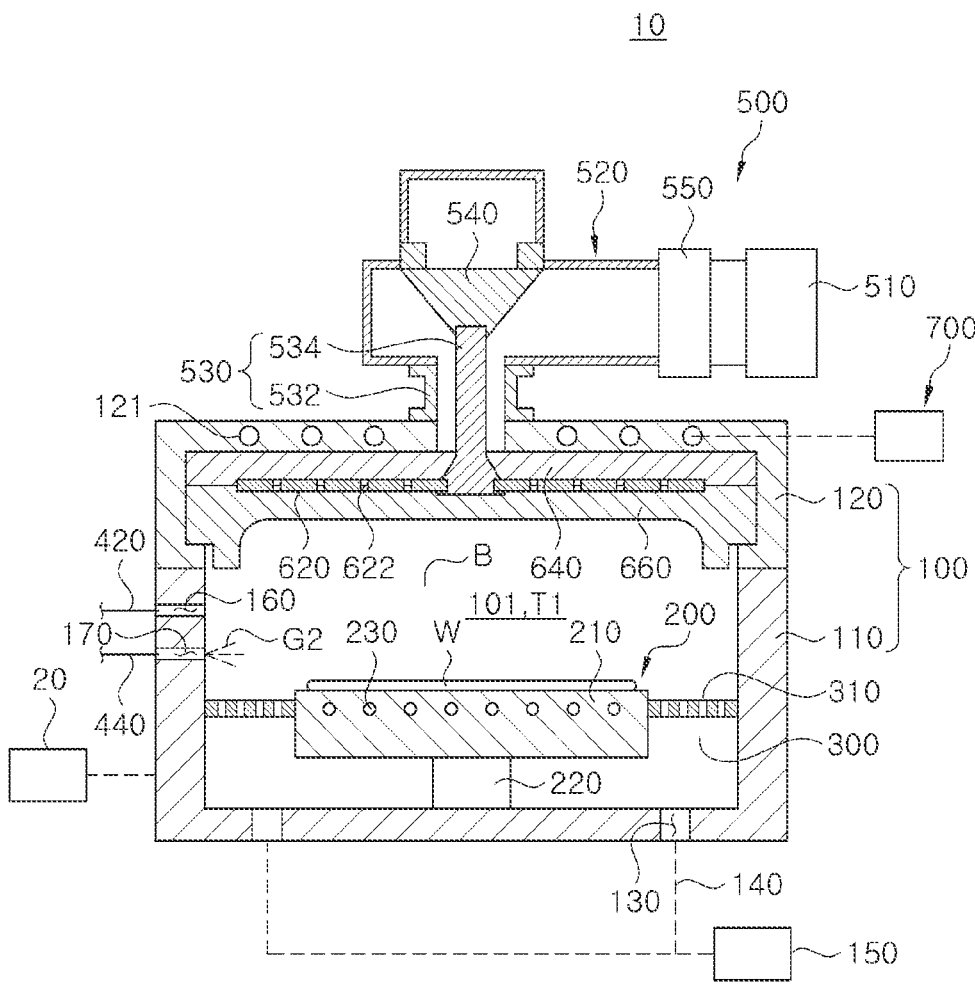
FIG. 7 is a diagram illustrating a state of an apparatus for processing a substrate in which a bake purge operation is performed according to the embodiment in FIG. 2.

FIG. 7 is a diagram illustrating a state of an apparatus for processing a substrate in which a bake purge operation is performed according to the embodiment in FIG. 2. Referring to FIGS. 2, 4 and 7, the bake purge operation (s420) according to an embodiment may perform purging of the processing space 101 formed at a high temperature and normal pressure. For example, in the bake purge operation (s420), purging gas g2 may be supplied to the processing space 101 formed at a high temperature and normal pressure using the purging gas supply member 440, and the purging gas g2 supplied to processing space 101 may be exhausted externally of processing space 101 using the pressure reduction unit 150. The bake purge operation (s420) may be performed for a predetermined period of time. For example, the bake purge operation (s420) may be performed for 30 minutes to 150 minutes.

The bake purge operation (s420) may be performed by determining the temperature of the processing space 101 to be a high temperature. For example, the temperature of processing space 101 in the bake purge operation (s420) may be determined to be a first temperature t1. The first temperature t1 may be a temperature between 100 and 200 degrees Celsius. In the bake purge operation (s420), the heating unit 230 may increase the temperature of the processing space 101 to the first temperature t1 by generating heat at a temperature equal to or higher than the first temperature t1.

The bake purge operation (s420) may be performed by forming an atmosphere in the processing space 101 at normal pressure. For example, the pressure of processing space 101 in the bake purge operation (s420) may be determined to be 1 to 600 Torr. More preferably, the pressure of processing space 101 in the bake purge operation (s420) may be determined to be 200 Torr. In the bake purge operation (s420), the pressure reduction unit 150 may exhaust the internal atmosphere of the processing space 101 and may determine the pressure of the processing space 101 to be normal pressure.

During the bake purge operation 1 (s420) in an embodiment, the pressure of the processing space 101 may be determined to be normal pressure and the temperature of the processing space 101 may be determined to be a high temperature, thereby improving fluidity of airflow in the processing space 101. Accordingly, impurities b attached to the fine valleys formed on the surface of the replaced component may be induced to deviate from the fine valleys into the processing space 101. Accordingly, the impurity b released into the processing space 101 may be discharged externally of the process chamber 100 by riding on the airflow of the purging gas g2 in the processing space 101 during the process of supplying the purging gas g2 to the processing space 101 and exhausting the gas. Accordingly, in the replacing operation (s30), the impurities b included in the replaced component may be easily and swiftly removed from the component.

Figure 8:
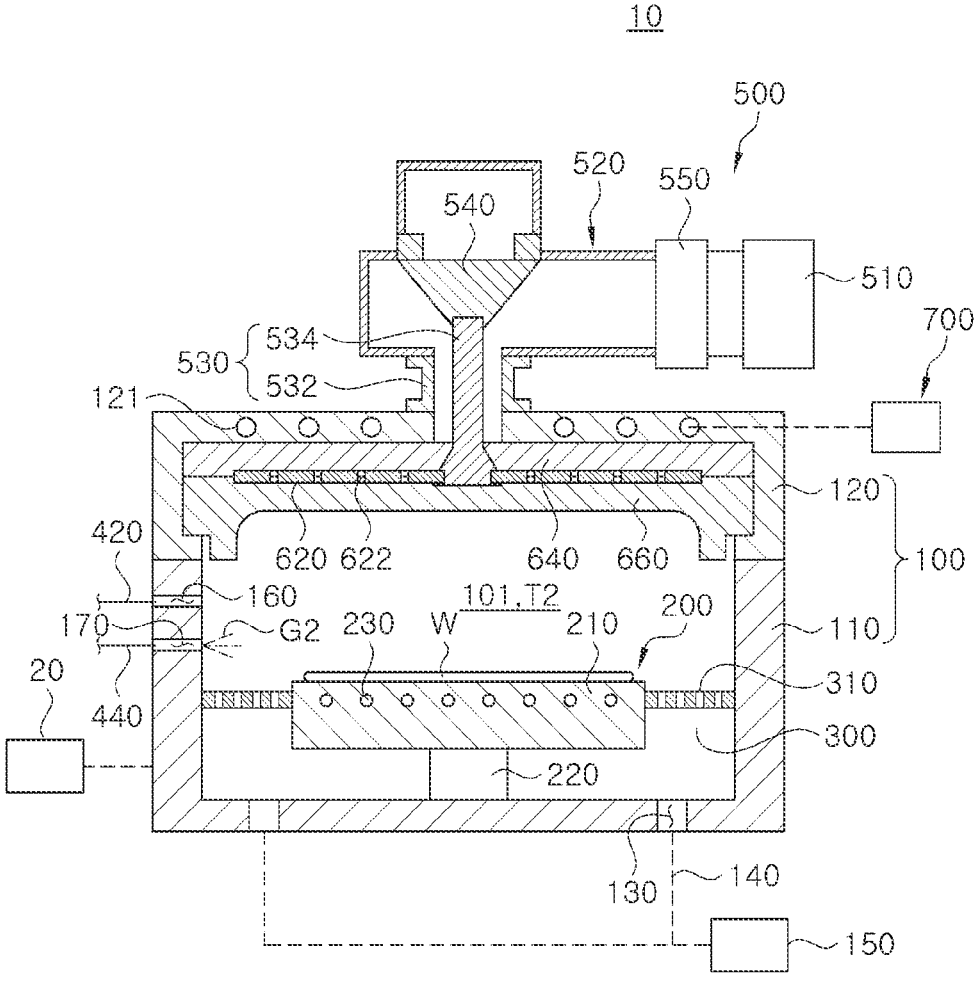
FIG. 8 is a diagram illustrating a state of an apparatus for processing a substrate in which a first purging operation is performed according to the embodiment in FIG. 2.

FIG. 8 is a diagram illustrating a state of an apparatus for processing a substrate in which a first purging operation is performed according to the embodiment in FIG. 2. Referring to FIGS. 2, 4, and 8, the primary purging operation (s430) may include purging of the processing space 101. The primary purging operation (s430) may be performed after the bake purge operation (s420) is completed. The primary purging operation (s430) may perform purging of the processing space 101 formed at room temperature. For example, in the primary purging operation (s430), the heating unit 230 may lower the temperature of the processing space 101 from the first temperature t1 to the second temperature t2 by adjusting the degree of heating. In an embodiment, the second temperature t2 may be room temperature. For example, the second temperature t2 may be a temperature between 0 and 50 degrees Celsius.

In the primary purging operation (s430), purging gas g2 may be supplied to the processing space 101 at room temperature. The purging gas g2 supplied to the processing space 101 may be discharged externally of the process chamber 100 by the pressure reduction unit 150. It may be possible to detect whether leakage occurs in the process chamber 100 by purging gas g2 supplied to the processing space 101. Also, as the processing space 101 is purged by the purging gas g2 supplied to the processing space 101, impurities b attached to the components disposed in the processing space 101 may be secondarily removed.

Figure 9:
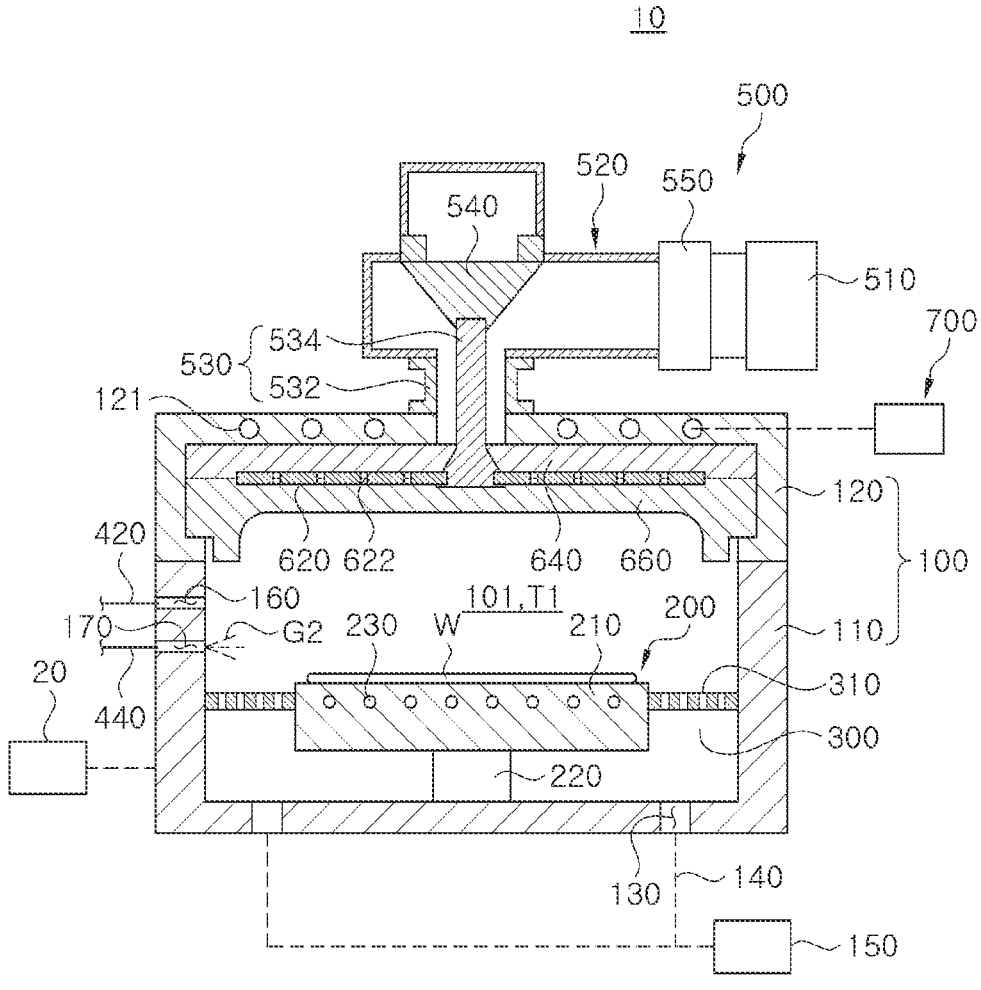
FIG. 9 is a diagram illustrating a state of an apparatus for processing a substrate in which a second purging operation is performed according to the embodiment in FIG. 2.

FIG. 9 is a diagram illustrating a state of an apparatus for processing a substrate in which a second purging operation is performed according to the embodiment in FIG. 2. Referring to FIGS. 2, 4, and 9, the secondary purging operation (s440)) may perform purging of the processing space 101. The secondary purging operation (s440) may be performed after the primary purging operation (s430) is performed. The secondary purging operation (s440) may perform purging of the processing space 101 formed at a high temperature. For example, in the secondary purging operation (s440), the heating unit 230 may increase the temperature of the processing space 101 further than the second temperature t2 by adjusting the degree of heat generation. For example, in the secondary purging operation (s440), the temperature of processing space 101 may be the first temperature t1. Optionally, in the secondary purging operation (s440), the temperature of the processing space 101 may be higher than the second temperature t2 and lower than the first temperature t1.

In the secondary purging operation (s440), purging gas g2 may be supplied to the processing space 101 at a higher temperature than the primary purging operation (s430). The purging gas g2 supplied to the processing space 101 may be discharged externally of processing space 101 by the pressure reduction unit 150. By the purging gas g2 supplied to the processing space 101, leakage in the process chamber 100 may be detected, and impurities b attached to the components disposed in the processing space 101 may be removed.

Referring to FIG. 2, the backup operation (s40) according to an embodiment may include a pre-cooling operation (s450) of lowering the temperature of the coolant having reached the predetermined target temperature to the predetermined starting temperature. More specifically, the pre-cooling operation (s450) may lower the temperature of the coolant back to the predetermined starting temperature while lowering the temperature of processing space 101 formed at a high temperature in the secondary purging operation (s440), such that an environment in the process chamber 100 in which the process of treating plasma may be performed later may be created. The pre-cooling operation (s450) may be performed after the secondary purging operation (s440) and may be performed last in the backup operation (s40).

Figure 3B:
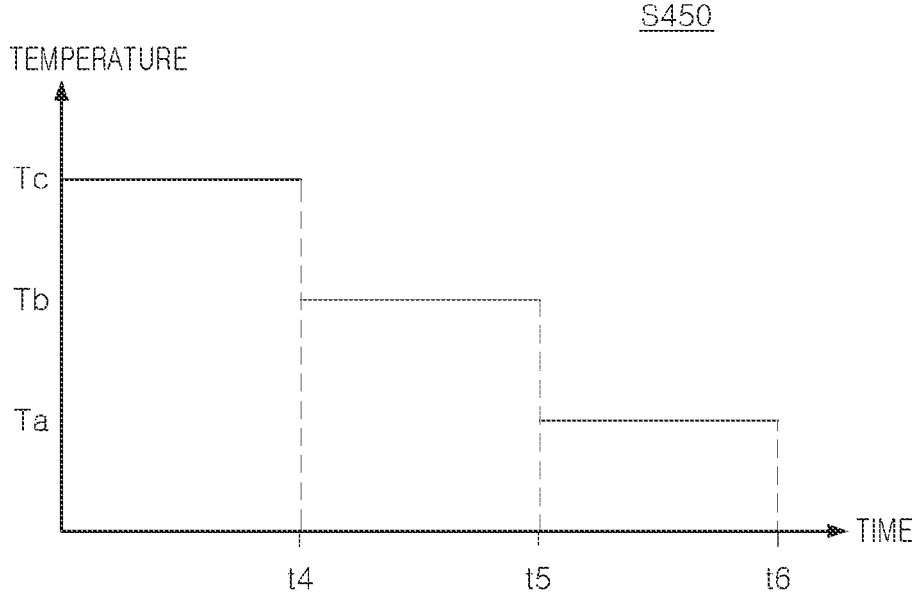
FIG. 3B is a graph illustrating changes in temperature over time in a pre-cooling operation according to an embodiment of the present disclosure.

Referring to FIG. 3b, the pre-cooling operation (s450) according to an embodiment may gradually lower the temperature of the coolant over a predetermined time to the starting temperature. For example, the temperature of the coolant may be lowered from the target temperature tc of 45 to 60 degrees Celsius to the intermediate temperature tb of 40 to 50 degrees Celsius after 2 minutes, and may lower the temperature back to the starting temperature ta of 35 to 40 degrees Celsius after 2 minutes. That is, by gradually ramping down the temperature of the coolant, overload of the process chamber 100 and the cooling path 121 to which the coolant is supplied may be prevented. The pre-cooling operation (s450) may be terminated when the temperature of the coolant reaches the predetermined starting temperature, and thereafter, the plasma treatment process, that is, the plasma treatment operation (s10), may be performed again. Accordingly, the pre-cooling operation (s450) may optimize the processing space 101, which created at a high temperature, into an environment in which the plasma treatment process may be performed.

According to the above-described embodiment, while the bake purge operation (s420) is performed, the processing space 101 may be created in an atmosphere of normal pressure and high temperature, thereby improving fluidity of airflow in the processing space 101. Accordingly, by inducing impurities b originally included in the replaced components in the replacing operation (s30) to be detached into processing space 101, the impurities b originally included in the components may be smoothly removed from the apparatus 10 for processing a substrate. Accordingly, a clean processing space 101 may be created, and impurities interfering with the surface of substrate w may be removed when substrate w is processed in plasma, thereby reducing a defect rate of the substrate w.

Also, since impurities b included in the components may be preemptively removed from the apparatus 10 for processing a substrate before the subsequent purging operation (s430 and s440) is performed, the time required to create a process environment in the subsequent purging operations (s430 and s440) may be shortened. Accordingly, by shortening the time required for the maintenance operation (s20), which is essential for the processing substrate w, efficiency in processing of the substrate w may be improved.

Also, the preheating operation (s410) and the pre-cooling operation (s450) may gradually raise and lower the temperature of the processing space 101, thereby preventing damage to the process chamber 100 and the cooling path 121 and preventing overload, and also, the temperature of processing space 101 may be optimized for the baking process or the plasma treatment process to be performed later.

Also, impurities may be removed from the surfaces of components such as the replaced dielectric plate 660, such that an electric field of microwaves may be uniformly formed in the processing space 101. Accordingly, density of the plasma acting on the substrate w may also be formed uniformly, such that yield of processing the substrate w may be improved.

According to the aforementioned embodiments, maintenance of an apparatus for processing a substrate may be performed efficiently.

Also, maintenance of an apparatus for processing a substrate may be performed swiftly.

Also, by preheating and precooling the processing space, the processing environment may be optimized.

Also, by gradually controlling the temperature of the processing space, overload of the apparatus for processing a substrate and temperature adjusting unit may be prevented.

Also, after replacing a component included in an apparatus for processing a substrate, impurities included in the surface of the component may be effectively removed.

While the embodiments have been illustrated and described above, it will be apparent to those skilled in the art that modifications and variations could be made without departing from the scope of the present disclosure as defined by the appended claims.

What is claimed is:

1. A method of processing a substrate using an apparatus for processing a substrate, comprising:
   a plasma treatment operation of processing a substrate using plasma;
   a replacing operation of performing the plasma treatment operation a predetermined number of times and replacing a component included in the apparatus; and
   a backup operation of backing up the apparatus after the replacing operation,
   wherein the backup operation includes:
   a preheating operation in which a temperature adjusting unit increases a temperature of the processing space by increasing a temperature of coolant supplied to the process space;
   a bake purge operation performed after the preheating operation and including removing impurities from the component;
   at least one purging operation of purging the processing space; and
   a pre-cooling operation including lowering a temperature of the processing space by lowering a temperature of the coolant to a predetermined starting temperature.

2. The method of claim 1, wherein the preheating operation includes gradually increasing a temperature of coolant over a predetermined time from a predetermined starting temperature.

3. The method of claim 2, wherein the preheating operation is terminated when a temperature of the coolant reaches a predetermined target temperature, and
   wherein the bake purge operation is performed after the preheating operation is completed.

4. The method of claim 3, wherein the bake purge operation includes forming an atmosphere of the processing space to be normal pressure and forming a temperature of the processing space to be 100 to 200 degrees Celsius.

5. The method of claim 4, wherein the bake purge operation includes supplying purging gas to the processing space.

6. The method of claim 1, wherein the at least one purging operation further includes:

a primary purging operation of purging the processing space; and a secondary purging operation of performing a secondary purge of the processing space after the primary purging operation.

7. The method of claim 6, wherein the pre-cooling operation is performed after the secondary purging operation is performed.

8. The method of claim 7, wherein the pre-cooling operation includes gradually lowering a temperature of the coolant to a starting temperature over a predetermined period of time.

9. The method of claim 8, wherein the pre-heating operation and pre-cooling operation includes controlling temperature of the coolant in units of 5 to 10 degrees Celsius according to a predetermined time interval by the temperature adjusting unit.

10. The method of claim 9, wherein the primary purging operation includes identifying leakage in the processing space by supplying purging gas to the processing space formed at room temperature, and primarily purging the processing space by exhausting the purging gas supplied to the processing space, and wherein the secondary purging operation includes identifying leakage in the processing space by increasing a temperature of the processing space and supplying purging gas to the processing space, and secondarily purging the processing space by exhausting the purging gas supplied to the processing space.

11. A method of processing a substrate, including replacing components included in an apparatus for processing a substrate and backing up the apparatus, wherein the backing up the apparatus includes:

a preheating operation in which a temperature adjusting unit increases a temperature of a processing space by increasing a temperature of coolant supplied to a process chamber;

a bake purge operation performed after the preheating operation and including removing impurities including moisture contained in the components and/or particles attached to the components;

at least one purging operation of purging the processing space; and a pre-cooling operation including lowering a temperature of the processing space to the starting temperature by lowering a temperature of the coolant.

12. The method of claim 11, wherein the preheating operation includes gradually increasing a temperature of the coolant over a predetermined period of time from a predetermined starting temperature to a predetermined target temperature.

13. The method of claim 12, wherein, in the bake purge operation, pressure in the processing space is formed to be normal pressure, wherein, in the bake purge operation, a temperature of the processing space is determined to be 100 to 200 degrees Celsius, and wherein the bake purge operation includes purging the processing space by supplying purging gas to the processing space in which the substrate is processed.

14. The method of claim 13, wherein the at least one purging operation includes a primary purging operation including identifying leakage in the processing space by supplying purging gas to the processing space formed at room temperature, and purging the processing space by exhausting the purging gas supplied to the processing space, and wherein the primary purging operation is performed after the bake purge operation.

15. The method of claim 14, wherein the at least one purging operation further includes a secondary purging operation including identifying leakage in the processing space by increasing a temperature of the processing space and supplying purging gas to the processing space formed at a relatively high temperature, and secondarily purging the processing space by exhausting the purging gas supplied to the processing space, after the primary purging operation.

16. The method of claim 15, wherein the pre-cooling operation is performed after the secondary purging operation.

* * * * *